United States Patent [19]

Lawton

[11] 4,247,827

[45] Jan. 27, 1981

[54] SURFACE ACOUSTIC WAVE FILTER ARRANGEMENT

[75] Inventor: Rodney J. Lawton, Shaw, England

[73] Assignee: Plessey Handel und Investments AG, Zug, Switzerland

[21] Appl. No.: 5,681

[22] Filed: Jan. 23, 1979

[30] Foreign Application Priority Data

Jan. 24, 1978 [GB] United Kingdom ................ 2882/78

[51] Int. Cl.³ .............................................. H03F 3/191
[52] U.S. Cl. ..................................... 330/306; 330/174; 330/307
[58] Field of Search .................. 330/65, 174, 302, 306, 330/307; 333/193, 240

[56] References Cited

U.S. PATENT DOCUMENTS

| 3,523,200 | 8/1970 | Newell | 333/193 X |
| 3,626,309 | 12/1971 | Knowles | 330/174 |

FOREIGN PATENT DOCUMENTS 1244652  3/1969  United Kingdom ..................... 333/193

OTHER PUBLICATIONS

Coussot et al., "Experimental Investigation of Mass—Producible Acoustic Surface Wave Filter," *Proceedings of the 29th Annual Frequency Control Symposium* May 29, 30, 1975, pp. 181–186.

*Primary Examiner*—James B. Mullins
*Attorney, Agent, or Firm*—Fleit & Jacobson

[57] ABSTRACT

A surface acoustic wave filter arrangement is provided in which both filter and associated driving amplifier are arranged in the same integrated circuit package.

3 Claims, 1 Drawing Figure

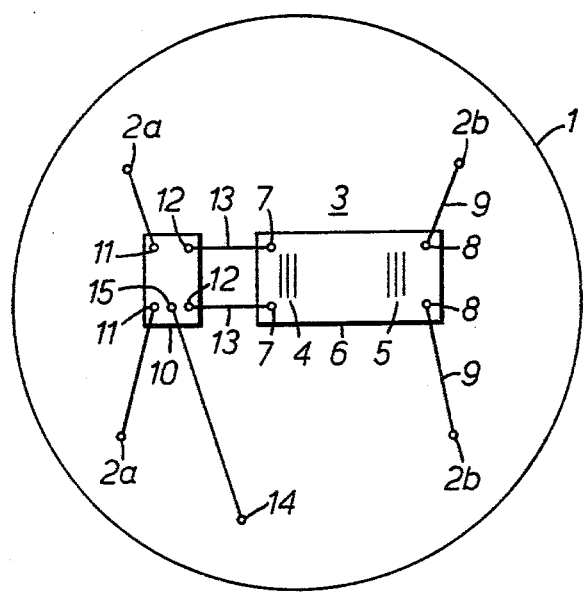

SURFACE ACOUSTIC WAVE FILTER ARRANGEMENT

This invention relates to a surface acoustic wave filter arrangement and is particularly, although not exclusively applicable to such arrangements for use in a television receiver I.F. circuit.

In a known example of such a surface wave filter arrangement, the filter is provided in an integrated circuit package, commonly a T03 can, and this package is mounted in circuit on a printed circuit board.

It is necessary to provide an amplifier to drive the filter and this is usually mounted on the board in the input circuit to the filter package. Two terminal pins of the package provide input connections to the surface wave filter and two further pins provide output connections and in the above mentioned known example one input pin is referred to ground potential on the circuit board whilst the output pins provide a balanced output.

A problem arises with this known example due to stray capacitance between the input and output pins of the filter package. Different stray capacitances can exist between different pairs of input and output terminal pins of the package and this can result in an error voltage being created between the output terminals in addition to the wanted filtered signals. The effect of this error voltage is to reduce the signal to noise ratio of the wanted signals.

This invention seeks to provide a surface acoustic wave filter arrangement in which the above mentioned problem is mitigated.

According to this invention there is provided a surface acoustic wave filter arrangement comprising a surface acoustic wave filter and a driving amplifier for the filter both arranged within an integrated circuit package and connection means provided between the amplifier and the filter.

Advantageously the connection means is bonding wire preferably of one thousandth of an inch diameter.

Conveniently balanced input connections are provided between the amplifier and the filter.

This invention will now be described further by way of example with reference to the accompanying single FIGURE drawing which shows schematically a plan view of a surface acoustic wave filter arrangement in accordance with this invention.

Referring to the drawing there is shown an integrated circuit package 1 which in this embodiment is of T08 package outline. The package 1 has four terminal pins 2 for providing input and output connections with pins 2a providing input terminals and pins 2b output terminals.

Arranged within the package 1 is a surface acoustic wave filter 3 having interdigital input and output transducers 4 and 5 respectively arranged on a surface acoustic wave propagating substrate 6 e.g. lithium niobate. The input transducer 4 has input terminals 7 and the output transducer output terminals 8, which latter terminals 8 are connected by bonding wires 9 to the terminal pin 2b of the package 1.

A driving amplifier 10 is also mounted within the package 1. The amplifier 10 has input terminals 11 connected to respective ones of the input terminal pins 2a of the package 1 one of which provides signal input, the other supply voltage input, and output terminals 12 which are connected by one thousandth of an inch diameter bonding wires 13 to respective ones of the terminals 7 of the input transducer 4 of the surface wave filters. An additional terminal pin 14 provides an earth reference for the amplifier 10 and is connected to an amplifier earth terminal 15. This pin 14 is connected to the package 1.

By providing the amplifier 10 within the package 1, the whole arrangement may be provided as a plug-in package providing considerable extra convenience over present arrangements in addition to cost reductions.

A further advantage lies in the fact that error voltages covered by differences in stray capacitance valves between different adjacent pairs of input/output terminals are reduced by approximately a factor equal to the gain of the amplifier 10, since the error voltage is proportional to the input voltage applied to the terminals 2a of the package 1 and this is reduced by a factor equal to the gain of the amplifier 10 when this item is arranged within the package 1.

Whilst the amplifier 10 has been illustrated as a single amplifier this need not be the case but the amplifier and consequently the package may provide an additional output for use as a tuner a.g.c. signal.

It must of course be understood that the package 1 illustrated is only by way of example and any convenient integrated circuit package may be used.

The amplifier 10 may also be provided with a balanced or an unbalanced input.

What we claim is:

1. A surface acoustic wave filter arrangement comprising an integrated circuit package having an input terminal for receiving input signals and an output terminal for providing output signals, said arrangement including:
   driving amplifier means for amplifying said input signals received by said input terminal to provide amplified signals;
   a surface acoustic wave filter having a signal-to-noise ratio, and including an input transducer formed by first and second interdigital electrodes, and an output transducer; and
   balanced interconnection means disposed between the driving amplifier means and the input transducer of said surface acoustic wave filter for applying said amplified signals to the input transducer in such a manner that said amplified signals applied to the first interdigital electrode of the input transducer are in anti-phase to said amplified signals applied to the second interdigital electrode, whereby to reduce direct coupling between the input and output transducers, and to improve the signal-to-noise ratio of the filter.

2. A surface acoustic wave filter arrangement as claimed in claim 1, in which the balanced interconnection means comprises bonding wire.

3. A surface acoustic wave filter arrangement as claimed in claim 2, in which the bonding wire is of one thousandth of an inch diameter.

* * * * *